United States Patent [19]

Fujiwara

[11] Patent Number: 5,268,685
[45] Date of Patent: Dec. 7, 1993

[54] APPARATUS WITH TRANSIENT-DEPENDENT BIT ALLOCATION FOR COMPRESSING A DIGITAL SIGNAL

[76] Inventor: Yoshihito Fujiwara, c/o Sony Corporation 7-35, Kitashinagawa 6-chome, Shinagawa-ku, Tokyo, Japan

[21] Appl. No.: 859,089

[22] Filed: Mar. 27, 1992

[30] Foreign Application Priority Data

Mar. 30, 1991 [JP] Japan .................. 3-092739

[51] Int. Cl.⁵ ............................. H03H 7/32
[52] U.S. Cl. .......................... 341/76; 381/30
[58] Field of Search ............ 341/76, 77; 381/29–40

[56] References Cited

U.S. PATENT DOCUMENTS

| | | | |
|---|---|---|---|
| 5,105,463 | 4/1992 | Veldhuis et al. | 381/30 |
| 5,109,417 | 4/1992 | Fielder et al. | 381/36 |
| 5,115,240 | 5/1992 | Fujiwara et al. | 341/51 |
| 5,142,656 | 8/1992 | Fielder et al. | 381/37 |
| 5,151,941 | 9/1992 | Nishiguchi et al. | 381/46 |

*Primary Examiner*—Marc S. Hoff
*Attorney, Agent, or Firm*—Limbach & Limbach

[57] ABSTRACT

A digital input signal is divided into signal components in plural frequency ranges by band division filters. The signal components thus obtained are divided in time into signal components in blocks in the respective frequency bands, and are also sent to a transient detector, which determines a transient state for each blocks. Changing an allowed noise level calculating circuit in response to the determined transient states, or any similar method, alters the quantizing bit numbers allocated to each block by an adaptive bit allocation circuit. The allocated bit numbers are altered depending upon the transient state of each block to improve the signal-to-noise ratio in blocks including a transient. Quantizing noise pre echo occurring before the transient, a phenomenon that is offensive to the ear, is prevented.

19 Claims, 7 Drawing Sheets

BEFORE FFT

AFTER IFFT

TEMPORAL MASKING

APPARATUS WITH TRANSIENT-DEPENDENT BIT ALLOCATION FOR COMPRESSING A DIGITAL SIGNAL

BACKGROUND OF THE INVENTION

1. Field of the Invention

This invention relates to an apparatus for compressing a digital signal, and more particularly to an apparatus that divides the digital input signal into signal components in blocks in both the frequency domain and the time domain and orthogonally transforms each block of signal components. The apparatus applies bit allocation to each block of orthogonally-transformed signal components to quantize them.

2. Description of the Prior Art

As one of technologies for compressing a digital audio signal, etc. orthogonal transform coding technology orthogonally transforms a digital input signal in the time domain into spectral coefficients in the frequency domain. The resulting spectral data is then quantized. As an example of orthogonal transform technology, Fast Fourier Transform (FFT) processing can be applied to a block of, e.g., audio PCM data containing a fixed number of samples in the time domain.

Further, a coding technology has been proposed in which an input signal is divided into signal components in plural frequency ranges prior to such orthogonal transform processing as that described above. The signal component in each frequency range is divided in time into blocks to orthogonally transform it, and bit allocation is applied to the orthogonally transformed signal component in each respective block.

A signal that has been orthogonally transformed by, e.g., a FFT, etc. in the compressor undergoes inverse Fast Fourier Transform (IFFT) processing the expander. At this time, in general, when the frequency analysis accuracy in the orthogonal transform processing is high, the accuracy in the time domain is degraded. This gives rise to a phenomenon called a pre-echo, in which a sound is heard at low level preceding itself. This is particularly noticeable at the beginning of a transient or non-steady portion of a signal. Such a phenomenon is subjectively disturbing to the listener, and has a great influence on the listener's perception of coding quality.

In the block B in the time domain shown in FIG. 7, the signal includes a portion C in which the level of the signal suddenly increases, e.g. as when castanets are played or a triangle is struck. The signal also includes the portion U in which there exists almost no signal (or in which the signal level is very small). When FFT processing is implemented on the signal in the block B, and IFFT processing is performed on the resulting compressed signal in the expander, quantizing noise is heard while there is no signal, i.e., during the portion U, as shown in FIG. 8.

The human sense of hearing has a characteristic called masking. Masking is classified into temporal masking and simultaneous masking. With simultaneous masking, a low-level sound produced simultaneously with a higher-level sound is rendered inaudible because it is masked by the higher-level sound. With temporal masking, a low-level sound preceding or succeeding a higher-level sound is rendered inaudible because it is masked by the higher-level sound. FIG. 9 illustrates temporal masking. In this, the higher-level sound C provides forward masking FM to low-level sounds following it in time. Forward masking is effective over a relatively long time (e.g about 100 msec). The higher-level sound C also provides backward masking BM to lower-level sounds preceding it in time. Backward masking is effective for only a relatively short time (e.g. about 5 msec).

For this reason, when the signal level suddenly rises towards the end of the block to which the FFT transform is applied, the resulting quantizing noise pre-echo preceding the transient is easily heard in the expanded signal. Quantizing noise pre-echo is subjectively offensive to the listener.

SUMMARY OF THE INVENTION

This invention has been proposed, and its object is to provide an apparatus for compressing a digital signal. The apparatus divides the digital input signal into signal components in plural frequency ranges, orthogonally transforms the signal components in the respective frequency ranges and applies adaptive bit allocation to them to quantize them. The apparatus is capable of effectively reducing quantizing noise for which no effective masking is available.

The apparatus for compressing a digital signal according to the invention includes a circuit that divides the digital input signal into signal components in plural frequency ranges and a circuit that divides the signal components in time into signal components in blocks in the respective frequency ranges. The apparatus further includes a circuit to orthogonally transform the signal components in blocks, and a circuit to allocate quantizing bit numbers to the orthogonally-transformed signal components in blocks, thereby to quantize them. The apparatus further includes a circuit that determines a transient state of a time domain signal in the time domain before the orthogonal transform processing. Finally, the apparatus includes a circuit that alters the bit numbers allocated to each of the blocks depending upon the transient state. This solves the above-described problems.

With respect to the above-mentioned transient state of a signal in the time domain, it is desirable to detect when the signal level suddenly rises, particularly when this occurs late in the orthogonal transform block.

In accordance with an apparatus for compressing a digital signal according to the invention, when orthogonal transform processing is applied to each of the blocks obtained by two-dimensionally dividing the input signal in both the time domain and the frequency domain, and bit numbers are allocated to the respective blocks to carry out quantizing, the transient state of a signal in the time domain before the orthogonal transform processing is determined. In response to this, the bit numbers allocated to the respective blocks are altered to increase bits allocated to a block or blocks in which the transient state indicates there is a transient. This reduces quantizing noise, and makes it possible to prevent so-called quantizing noise pre-echo from being heard just before a transient.

DESCRIPTION OF THE PREFERRED EMBODIMENT

Figure 1:
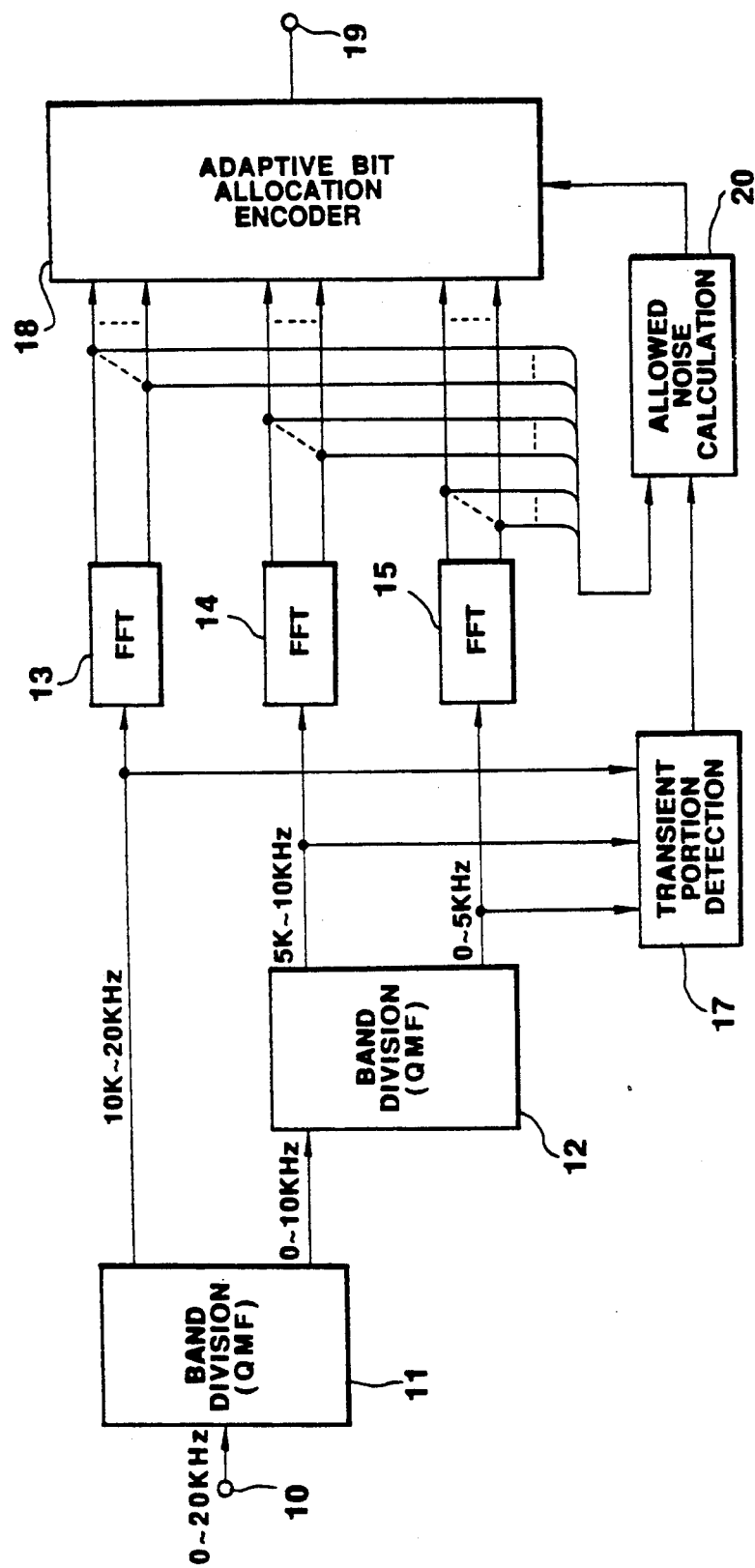
FIG. 1 is a block diagram showing the configuration of an apparatus for compressing a digital signal according to the invention.

FIG. 1 shows the configuration of part of an apparatus for compressing a digital signal, in which orthogonal transform processing and block floating processing are combined, as an embodiment of the invention.

In the apparatus shown in FIG. 1, the digital input signal is divided into signal components in plural frequency ranges having bandwidths that increase with increasing frequency. Orthogonal transform processing is applied to the signal component in each frequency range. Quantizing bits are adaptively allocated to quantize the resulting spectral data in the frequency domain. The quantizing bits are allocated according to so-called critical bands to take account of the frequency-resolution characteristic of the human sense of hearing. This will be described in detail below. This technique uses a combination of the technologies of subband division coding (SBC), adaptive transform coding (ATC), and adaptive bit allocation (APC-AC).

In FIG. 1, the input terminal 10 is supplied with a PCM digital audio input signal having a bandwidth of, e.g., 0 Hz to 20 kHz. The input signal is divided into a signal in the frequency range of 0 Hz to 10 kHz and a signal component in the frequency range of 10 to 20 kHz by the band division filter 11, which is preferably a so-called Quadrature Mirror (QMF) filter. The signal in the frequency range of 0 Hz to 10 kHz is further divided into a signal component in the frequency range of 0 Hz to 5 kHz and a signal component in the frequency range of 5 to 10 kHz by the band division filter 12, which is also preferably a QMF filter.

The signal component in the frequency range of 10 to 20 kHz from the band division filter 11 is sent to the Fast Fourier Transform (FFT) circuit 13, which is an example of an orthogonal transform circuit. The signal component in the frequency range of 5 to 10 kHz from the band division filter 12 is sent to the FFT circuit 14. The signal component in the frequency range of 0 Hz to 5 kHz from the band division filter 12 is sent to the FFT circuit 15. The FFT circuits 13, 14 and 15 each apply FFT processing to a respective one of the three signal components.

Figure 2:
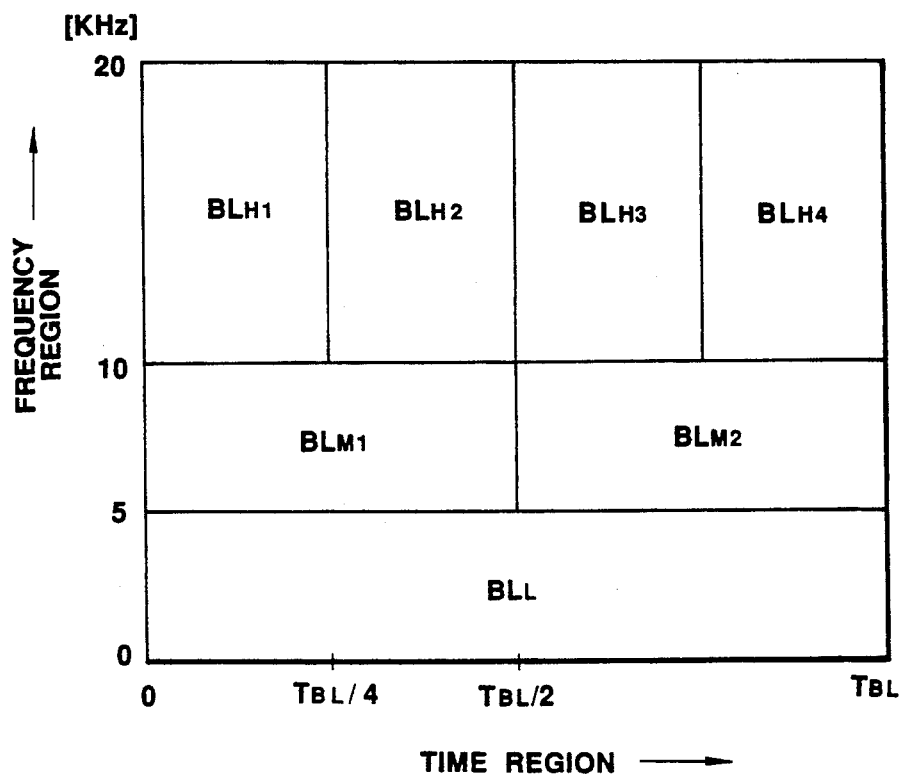
FIG. 2 shows an example of how the digital input signal is divided into frequency ranges and how the signal component in each frequency range is divided into blocks in the time domain in the apparatus according to the invention.

A practical example of how the input signal is divided into blocks in each frequency range delivered to the FFT circuits 13, 14 and 15 is shown in FIG. 2. In the practical example shown in FIG. 2, the bandwidth of the signal components is broadened and the time resolution is increased (i.e., the block length is reduced) with increasing frequency of the frequency range. In the low frequency range of 0 Hz to 5 kHz, one block $BL_L$ is chosen to have, e.g., 1024 samples. In the medium frequency range of 5 to 10 kHz, 1024 samples are divided into two blocks, $BL_{M1}$ and $BL_{M2}$, each having a length $T_{BL}/2$. This is one half of the length $T_{BL}$ of the block $BL_L$ in the low frequency range. In the high frequency range of 10 to 20 kHz, 1024 samples are divided into four blocks, $BL_{H1}$, $BL_{H2}$, $BL_{H3}$ and $BL_{H4}$, each having a length $T_{BL}/4$. This is one fourth of the length of the block $BL_r$ in the low frequency range.

If the input signal has a bandwidth of 0 Hz to 22 kHz, the low frequency range extends from 0 Hz to 5.5 kHz, the medium frequency range extends from 5.5 to 11 kHz, and the high frequency range extends from 11 to 22 kHz.

Returning to FIG. 1, the signal components in the time domain in the respective frequency ranges derived from the input signal by the band division filters 11 and 12 are fed into the FFT circuits 13, 14 and 15, and also into the transient detector 17. The transient detector 17 detects transient portions, or non-steady portions, in each block of the signal component in each of the frequency ranges shown in FIG. 2.

The spectral data or FFT coefficient data in the frequency domain resulting from the FFT processing by the FFT circuits 13, 14 and 15 is grouped into critical bands, and is sent to the adaptive bit allocation circuit 18. The audio frequency range is divided into critical bands to take account of the frequency resolution characteristic of the human sense of hearing. A critical band is a band of noise that is masked by a pure sound having the same intensity as the noise, and a frequency in the middle of the band of noise. Critical bands are such that their bandwidth increases with increasing frequency. The entire audio frequency range of 0 Hz to 20 kHz is normally divided into 25 critical bands.

The allowed noise level calculating circuit 20 calculates an allowed noise level for each critical band on the basis of the spectral data in the critical band, taking account of masking. Then, an allocated bit number is calculated for each critical band on the basis of the allowed noise level and the energy or the peak value in the critical band. The spectral data in the critical band is requantized using the bit number allocated to the critical band by the adaptive bit allocation circuit 18. The quantized spectral data is fed to the output terminal 19.

The allowed noise level calculating circuit 20 is supplied with the output of the transient detector 17. The allowed noise level calculating circuit corrects the allowed noise level for each critical band in response to the transient detector output. This alters, by increasing or decreasing, the allocated bit numbers allocated to each critical band by the adaptive bit allocation circuit 18.

A practical example of how a transient is detected and how the allocated bit numbers are altered will now be described.

To detect the transient state of the signal component in the time domain in each block shown in FIG. 2, each block is divided into four sub blocks. The transient state of the signal component in each block is determined by calculating an energy difference or an energy ratio between the sub blocks into which the block is divided. For example, if a block consists of 64 samples, $x_0$ to $x_{63}$, the 64 samples are divided in time into samples in four sub blocks, each of 16 samples, namely, $x_0$ to $x_{15}$, $x_{16}$ to $x_{31}$ $x_{32}$ to $x_{47}$, and $x_{48}$ to $x_{63}$. Then, the sum of the squares of the samples in each sub block is calculated. These sums of squares will be called $P_1$, $P_2$, $P_3$ and $P_4$, respectively. For example, $P_1$ is $x_0^2 + \ldots + x_{15}^2$. Then, it is determined whether the sums of squares satisfy the conditional expressions set forth below to determine a mode that indicates the transient state of the signal component in the block. For example, When $(P_2 + P_3 + P_4)P_1 < k_1$, a block with this transient state is determined to be mode 0 block.

When $(P_2 + P_3 + P_4)/P_1 \geq k_1$, and $(P_3 + P_4)/P_2 < k_2$, a block with this transient state is determined to be mode 1 block.

When $(P_3 + P_4)/P_2 \geq k_2$, and $P_4/P_3 < k_3$, a block with this transient state is determined to be a mode 2 block.

When $P_4/P_3 < k_3$, a block with this transient state is determined to be a mode 3 block. In these conditional expressions, $k_1$ is, e.g., 9, $k_2$ is, e.g., 6, and $k_3$ is, e.g., 3.

Mode 0 indicates that the signal component in the block is a substantially steady state signal. As the mode number increases, this indicates that the signal component in the block includes a transient, and that the rising portion of the transient occurs progressively later in the block, resulting in a greater likelihood of quantizing noise being audible. When a rising transient occurs towards the end of a block, temporal masking is ineffective, so quantizing noise will be heard by the listener. In view of this, it is desirable apply an alteration or correction to increase the bit number allocated to quantize the spectral data resulting from orthogonally transforming a block or blocks having a greater mode number.

First, bits remaining after the primary bit allocation has been made taking account of masking in the frequency domain are preferentially allocated to blocks having mode numbers 1 to 3. In this allocation, priority is given in the order of mode numbers 3, 2 and 1.

Second, it is preferable to allocate to a block that is particularly questionable, e.g., a mode 3 block, an increased number of bits during the primary bit allocation. Accordingly, instead of carrying out the primary bit allocation taking account of masking, it is preferable to carry out a primary bit allocation that provides a maximum signal-to-noise ratio, as perceived by the listener.

Third, when an insufficient number of bits remains after the primary bit allocation has been carried out, the number of bits allocated to mode 0 blocks is reduced to provide bits for later allocation to mode 1, 2 and 3 blocks.

Fourth, when allocating bits to mode 1 to 3 blocks, it is preferable to allocate bits to bands having a higher energy to improve the signal-to-noise ratio.

As stated above, the transient state of the signal component in each block shown in FIG. 2 is determined and a corresponding mode number is generated. The number of allocated bits is altered, corrected o reallocated depending on the mode number to increase the number of bits allocated to a block or blocks in which pre-echo is likely to occur. This improves the signal-to-noise ratio perceived by the listener.

Figure 3:
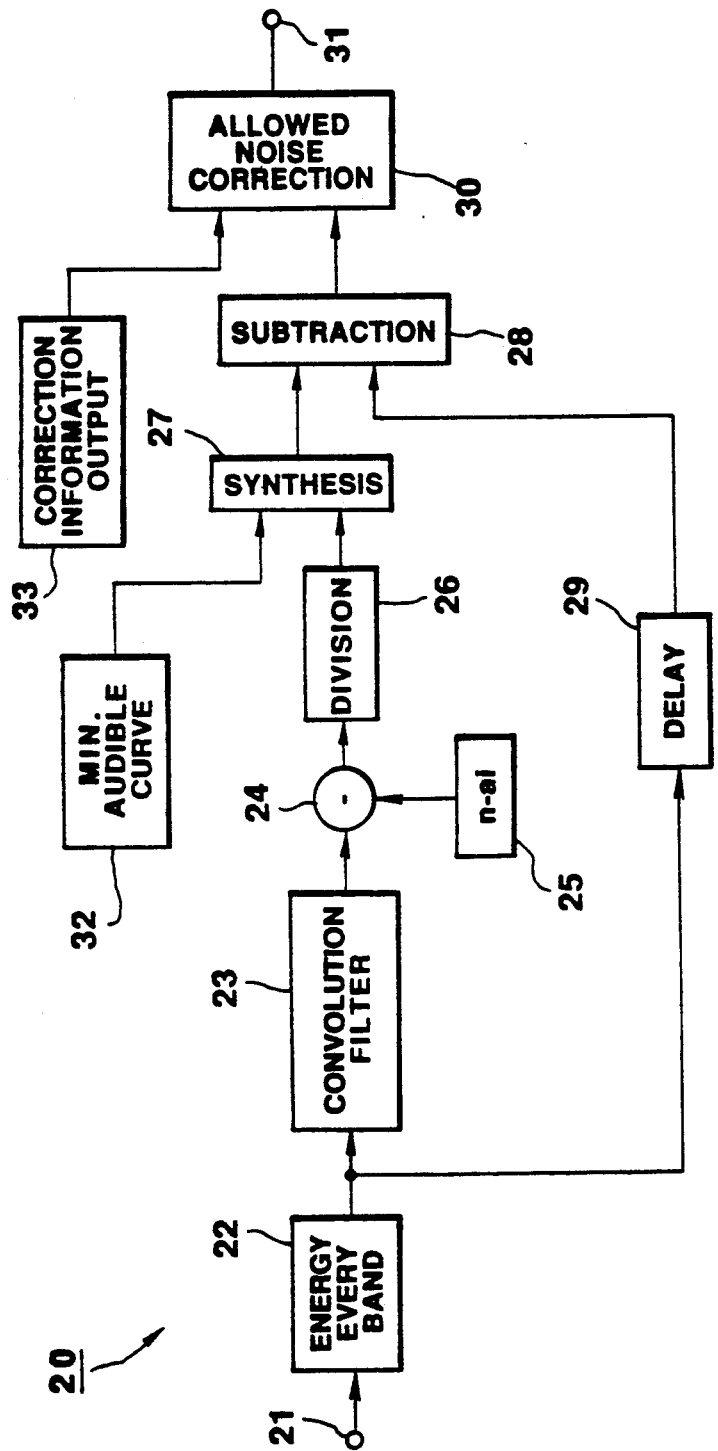
FIG. 3 is a block diagram showing an example of the allowed noise level calculating circuit 20 in the apparatus shows in FIG. 1.

FIG. 3 is a block diagram showing the configuration of a practical example of the allowed noise level calculating circuit 20. In FIG. 3, the input terminal 21 is supplied with the spectral data in the frequency domain from the FFT circuits 13, 14 and 15. This data includes an amplitude value and a phase value calculated from the real number component and the imaginary number component of FFT coefficient data resulting from the FFT operation. This approach is employed because the human sense of hearing is sensitive to level in the frequency domain, but is considerably less sensitive to phase.

Figure 4:
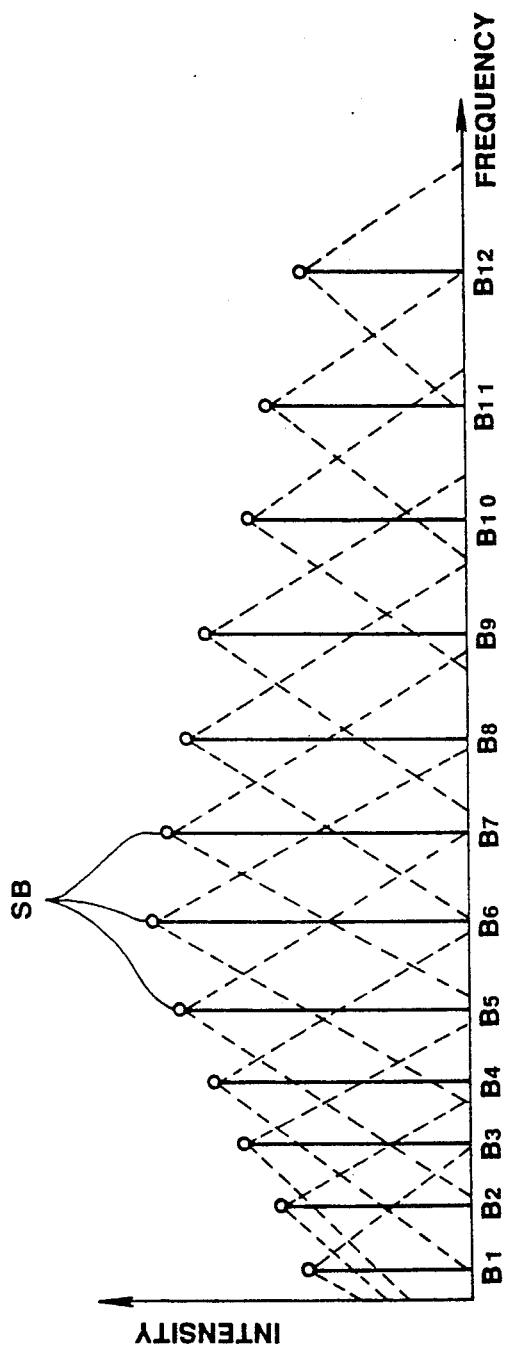
FIG. 4 shows a bark spectrum.

The spectral data in each critical band is sent to the energy calculating circuit 22, which determines the energy in each critical band by calculating the sum of the amplitude values of the spectral data in the critical band, or by some other method. Instead of the energy in each critical band, the peak, or the mean, of the amplitude values may be used. The output from the energy calculating circuit 22 is a spectrum of the energy in each critical band, and is usually called a bark spectrum. FIG. 4 shows a bark spectrum SB. Only twelve critical bands ($B_1$ to $B_{12}$) are shown to simplify the illustration.

To determine the masking effect of the bark spectrum SB, convolution processing is applied to the bark spectrum SB. The bark spectrum is multiplied by a predetermined weighting function and the resulting products are summed. To realize this, the output from the energy calculating circuit 22 in each critical band, i.e., the respective values of the bark spectrum SB, are sent to the convolution filter circuit 23. The convolution filter circuit 23 comprises, e.g., plural delay elements for sequentially delaying input data, plural multipliers (e.g., 25 multipliers, one for each critical band), for multiplying the output of each delay element by a filter coefficient or weighting function, and an adder for summing the multiplier outputs. The convolution processing determines the portions indicated by dotted lines in FIG. 4.

Masking refers to the phenomenon by which a signal is rendered inaudible to the human sense of hearing when it is masked by another signal. As described above, masking includes temporal masking in the time domain, and simultaneous masking in the frequency domain. Noise that is masked temporarily or simultaneously will be inaudible. Consequently, in an actual audio signal, noise within the temporal or simultaneous masking range of the signal is regarded as allowed noise.

A practical example of filter coefficients of the respective multipliers of the convolution filter circuit 23 will now be described. Assuming that the filter coefficient of a multiplier M corresponding to an arbitrary band is 1, the multiplying operation is carried out as follows: at the multiplier M-1, the outputs from respective delay elements are multiplied by the filter coefficient 0.15; at the multiplier M-2, these outputs are multiplied by the filter coefficient 0.0019; at the multiplier M-3, the filter coefficient 0.0000086. At the multiplier M+1, these outputs are multiplied by the filter coefficient 0.4; at the multiplier M+2, these outputs are multiplied by the filter coefficient 0.06; and at the multiplier M+3, these outputs are multiplied by the filter coefficient 0.007. In this way, convolution processing of the bark spectrum SB is carried out. M is an arbitrary integer between 1 and 25.

The output of the convolution filter circuit 23 is fed into the subtractor 24. The subtractor 24 determines a level $\alpha$ in the convoluted region corresponding to the allowed noise level. This will be described later. The level $\alpha$ corresponding to the allowed noise level is the level that will become the allowed noise level in each critical band after carrying out the deconvolution processing that will be described below.

An allowed function, which represents the masking level, for determining the level $\alpha$ is delivered to the subtractor 24. Increasing or decreasing the allowed function controls the level $\alpha$. The allowed function is generated by the function generator 25, which will be described below.

When the number of the critical band is i, the number of the lowest-frequency critical band being 1, the level $\alpha$ corresponding to the allowed noise level is determined by the following equation:

$$a = S - (n - ai) \ldots (1)$$

where n and a are respectively constants (a>0), and S is intensity of the convolution-processed bark spectrum. In equation (1), (n-ai) represents the allowed function. In the preferred embodiment, n is set to 38 and a is set to 1. With these settings, there is no degradation of the sound quality. The resulting compressed signal is therefore satisfactory.

In this way, the level $\alpha$ is determined and is transmitted to the divider 26. The divider 26 applies deconvolution to the level $\alpha$ in the convoluted region. Carrying out deconvolution derives the masking spectrum from the level $\alpha$. The masking spectrum becomes the allowed noise spectrum. While deconvolution processing normally requires complicated processing, deconvolution is carried out in this embodiment by the simple divider 26.

Figure 5:
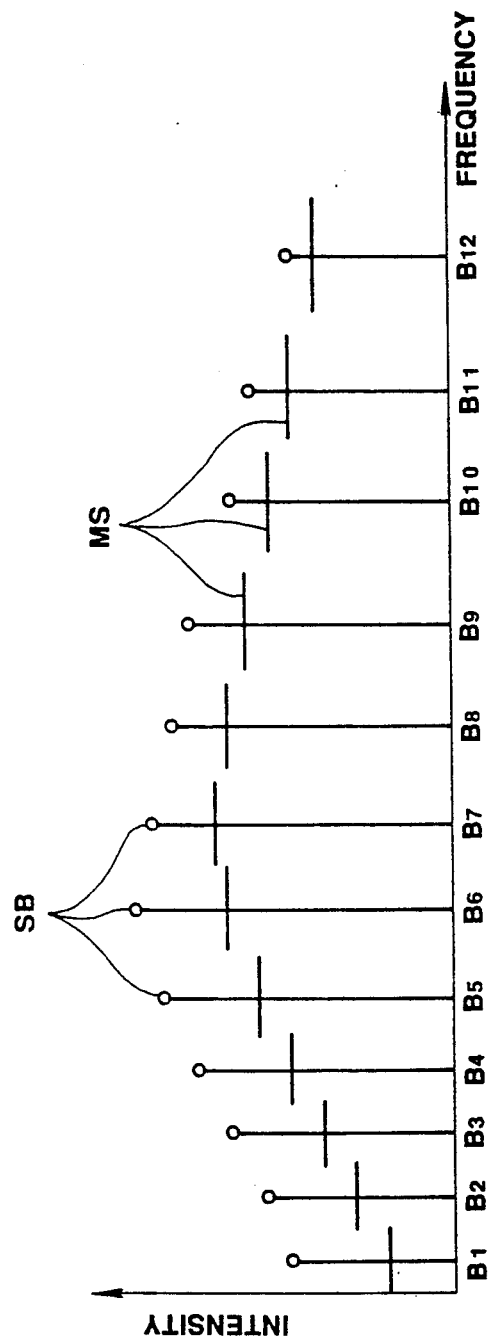
FIG. 5 shows a masking spectrum.

The masking spectrum is transmitted to the subtractor 28 via the synthesis circuit 27. The subtractor 28 also receives the output of the energy calculating circuit 22 for each critical band, i.e., the bark spectrum SB, via the delay circuit 29. The subtractor 28 performs a subtraction operation between the masking spectrum and the bark spectrum SB. FIG. 5 shows how the portion of the bark spectrum SB below the level of the masking spectrum MS is masked.

The output of the subtractor 28 is fed via the allowed noise corrector 30 and the output terminal 31 to a ROM etc. (not shown) in which allocated bit number information is stored. This ROM, etc. provides allocated bit number information for each critical band corresponding to the output of the subtractor 28, corrected by the allowed noise corrector 30. The corresponds to the level difference between the energy of each band and the allowed noise level. The allocated bit number information is sent to the adaptive bit allocation circuit 18, which quantizes the spectral data generated by the FFT circuits 13, 14 and 15 using the bit number allocated to each critical band.

The adaptive bit allocation circuit 18 quantizes the spectral data in each critical band using bit numbers allocated depending on the difference between the energy of each critical band and the respective allowed noise level. The delay circuit 29 is provided to delay the bark spectrum SB from the energy calculating circuit 22 to take account of delay in the circuits preceding the synthesis circuit 27.

Figure 6:
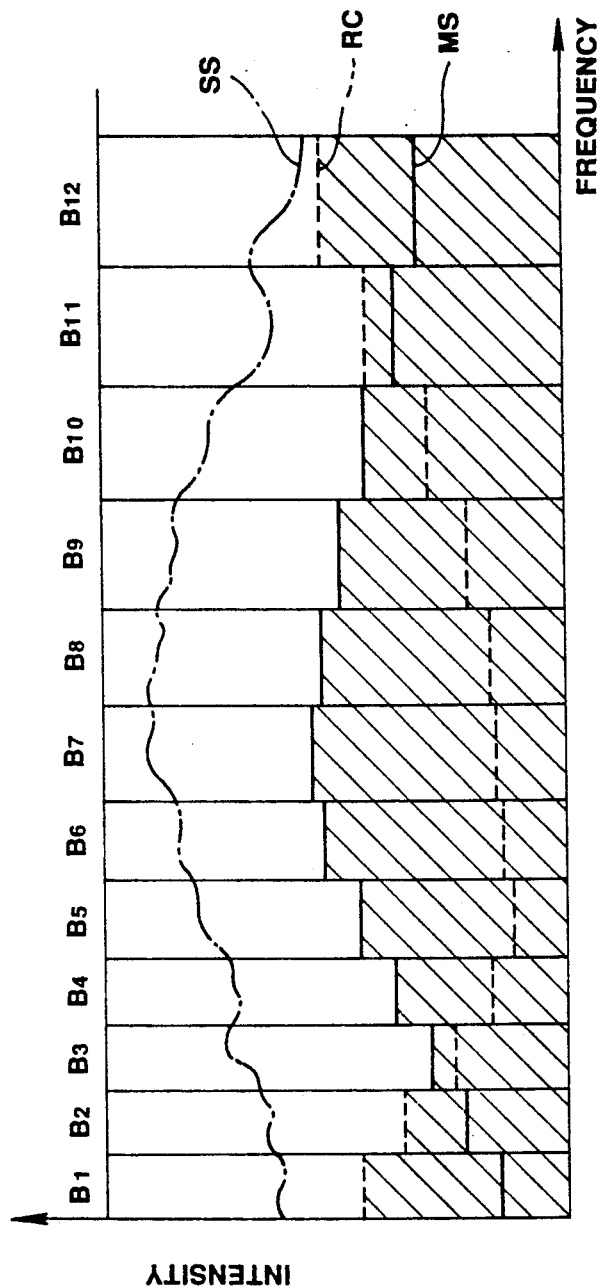
FIG. 6 shows a minimum audible level curve synthesized with a masking spectrum.
Figure 7:
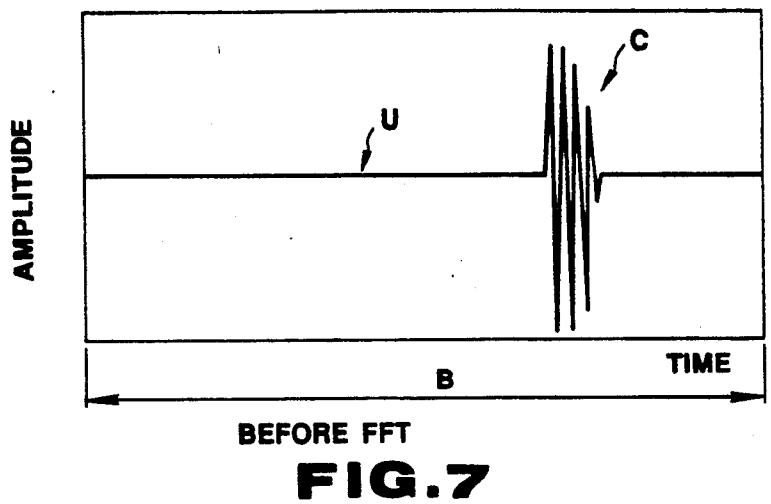
FIG. 7 shows an example of a signal in which there is a transient in the block subject to orthogonal transform processing.
Figure 8:
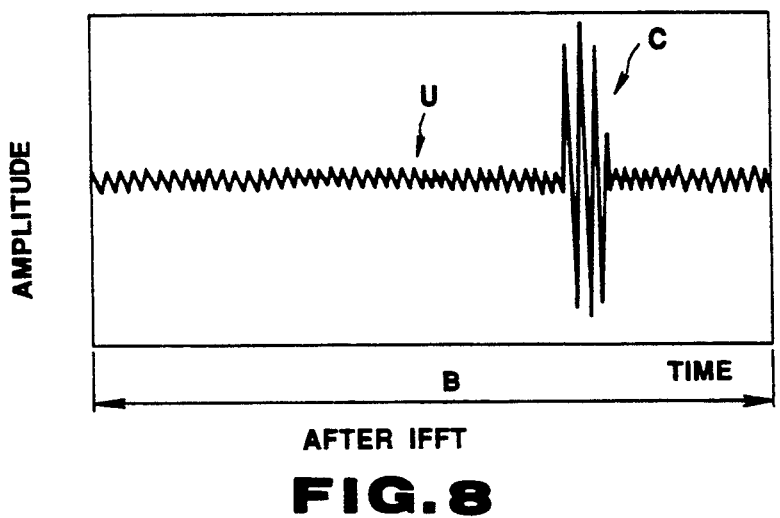
FIG. 8 shows the signal shown in FIG. 7 after it has been subject to a forward and an inverse orthogonal transform.
Figure 9:
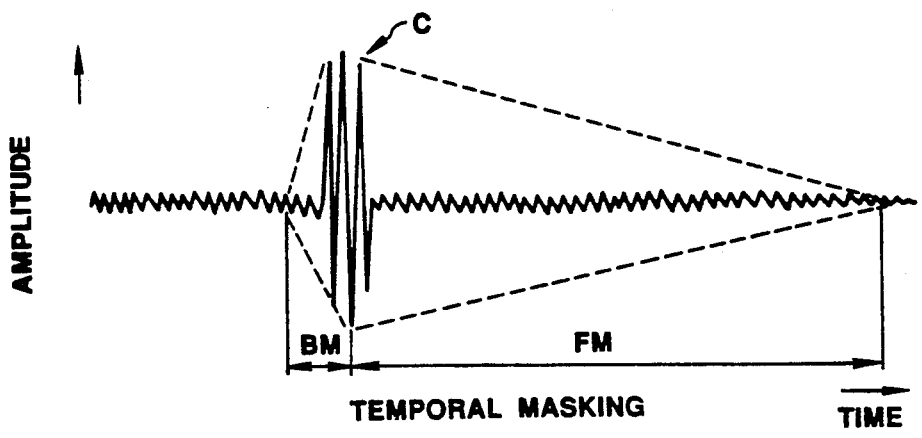
FIG. 9 illustrates temporal masking.

The synthesis circuit 27 synthesizes data indicating the so-called minimum audible level curve RC and the masking spectrum MS, as shown in FIG. 6. The minimum audible level curve is another characteristic of the human sense of hearing and is generated by the minimum audible level curve generator 32. If the absolute noise level is below the minimum audible level curve, this noise cannot be heard. For a given quantization, the minimum audible level curve varies, depending on the loudness level when the signal is reproduced. However, since the manner in which music fits within the dynamic range provided by a 16-bit digital system does not vary greatly, if quantizing noise is inaudible in the frequency band to which the ear is most sensitive, i.e., in the frequency band in the vicinity of 4 kHz, it can be assumed that quantization noise less than the level of the minimum audible curve will be inaudible in other frequency bands. Accordingly, when the noise level in the vicinity of 4 kHz corresponding to the word length set by the system is not heard, the allowed noise level can be provided by synthesizing the minimum audible curve RC and the masking spectrum MS. The resulting allowed noise level in each critical band may be up to the level indicated by the cross-hatched portion in FIG. 6. In this embodiment, the level of the minimum audible curve at 4 kHz is set to correspond to the minimum level corresponding to quantizing using, e.g., 20 bits. FIG. 6 also shows the signal spectrum SS.

The allowed noise level corrector 30 corrects the allowed noise level at the output of the subtractor 28 in response to information sent from the correction information output circuit 33. The correction information output circuit 33 provides correction information in response to the modes indicating the transient state determined by the transient detector 17 for the signal component in each block shown in FIG. 2. Thus, the allowed noise level a the output of the subtractor 28 is corrected so that the bit allocation for each block is corrected according to the mode of each block, as described above.

The allowed noise level is corrected in response to information indicating an error between the detected quantity of output bits used for quantizing by the quantizing circuit 18 and the target bit rate of the final compressed data. The reason why such a correction is made is as follows: there are instances where the total number of bits allocated by applying a temporary adaptive bit allocation to all blocks to which bits are to be allocated may be in error with respect to the number of bits corresponding to the target bit rate. In such instances, the bit allocation is repeated to reduce the error to zero. When the total number of bits allocated is less than the target value, bit number differences ar allocated to the blocks to reduce the deficit in the number of bits. When the total number of bits allocated is greater than the target value, bit number differences are allocated to the blocks to reduce the surplus in the number of bits.

To achieve this, the error between the target value and the total number of bits allocated is determined. In response to this error, the correction information output circuit 33 provides correction data for correcting the respective allocated bit numbers. When the error indicates that insufficient bits have been allocated, an increased number of bits is used per block, so that consideration can be made of when the total number of allocated bits is greater than the target value. In contrast, when the error indicates that excess bits have been allocated, fewer bits can be used for each block, so that consideration can be made of when the total number of allocated bits is less than the target value. Accordingly, the correction information output circuit 33 provides, in response to the error, data indicating a correction value to correct the allowed noise level at the output of the subtractor 28, e.g., in response to mode information indicating the transient state of each block. The correction value described above is transmitted to the allowed noise corrector 30 to correct the allowed noise level at the output of the subtractor 28.

The correction information output circuit 33 can also provide correction information based on the so. called equi-loudness curve. The allowed noise level at the output of the subtractor 28 is corrected in response to correction information that takes account of modes indicating the transient state and the equi-loudness curve.

The equi-loudness curve is yet another characteristic curve relating to the human sense of hearing. The curve is derived by determining the sound pressure level at various frequencies that is heard at the same intensity as that of a pure sound at 1 kHz. The equi-loudness curve is similar to the minimum audible level curve RC shown in FIG. 6. In the equi-loudness curve, for example, a sound in the vicinity of 4 kHz is heard at the same intensity as that of a sound at 1 kHz even if the sound pressure level of the 4 kHz sound is 8 to 10 dB less than that of the 1 kHz sound. In contrast, a sound in the vicinity of 50 Hz must have a sound pressure level of about 15 dB greater than the 1 kHz sound to be perceived as having at the same intensity as the 1 kHz sound. For this reason, the allowed noise level should have a frequency characteristic given by a curve corresponding to the equi-loudness curve. It can be seen that correcting the allowed noise level by taking the equi-loudness curve into consideration adapts the system to the characteristics of the human sense of hearing.

It is to be noted that this invention is not limited to the above-described embodiment, but is applicable not only to a signal processing apparatus for compressing a digital audio signal but also to a signal processing apparatus for compressing a digital speech signal or a digital video signal, etc Further, the synthesis processing for the minimum audible level curve may be omitted. In this case, minimum audible level curve generator 32 and synthesis circuit 27 are unnecessary, and the output of the subtractor 24 is deconvoluted by the divider 26, and is transmitted directly to the subtractor 28. In addition, not only FFT processing but also DCT (Discrete Cosine Transform) processing, etc., may be used for the orthogonal transform processing.

What is claimed is:

1. An apparatus for compressing a digital input signal, the apparatus comprising:
   frequency dividing means for dividing the digital input signal into signal into signal components in plural frequency ranges;
   time dividing means for dividing the components in time into a signal component in blocks in each frequency range;
   orthogonal transform processing means for orthogonally transforming the signal components in blocks;
   bit allocating means for allocating quantizing bit numbers to the orthogonally-transformed signal components in blocks, thereby to quantize them;
   transient state determining means for determining a transient state of a time domain signal before the orthogonal transform processing means; and
   bit number altering means for altering the bit numbers allocated to the orthogonally-transformed signal components in blocks in response to the transient state determined by the transient state determining means.

2. The apparatus of claim 1, wherein:
   each frequency range has a bandwidth; and
   the frequency dividing means divides the digital input signal in frequency such that the bandwidths of the frequency ranges increase with increasing frequency of the frequency range.

3. The apparatus of claim 1, wherein:
   each block has a block length; and
   the time dividing means divides the signal components in time into blocks so that block lengths decrease with increasing frequency of the frequency range.

4. The apparatus of claim 1, wherein:
   the orthogonally-transformed signal components in blocks are combined into critical bands, and
   the bit allocating means allocates a quantizing bit number for each critical band on the basis of an allowed noise level for each critical band.

5. The apparatus of claim 4, wherein the transient state determining means determines the transient state of each block of each signal component in blocks in each frequency range before the orthogonal transform processing means.

6. The apparatus of claim 4, wherein the bit number altering means alters the bit numbers by changing the allowed noise level in response to the transient state determined by the transient state determining means.

7. The apparatus of claim 1, wherein:
   the time domain signal has a level and is divided in time into blocks;
   a change in the level of the time domain signal in a block has a position in the block and an amplitude; and
   the transient state determining means generates a mode number indicating the transient state of a block of the time domain signal in response to the position in the block and the amplitude of a change in the level of the time domain signal.

8. The apparatus of claim 7, wherein the transient state determining means generates a greater mode number for blocks in which the level of the time domain signal rises late in the block.

9. The apparatus of claim 7, wherein the bit number altering means receives the mode number for each block from the transient state determining means and increases the bit numbers allocated to blocks having a high mode number.

10. The apparatus of claim 9, wherein:
    the orthogonally-transformed signal components in blocks are combined into critical bands;
    the bit allocation means allocates a quantizing bit number for each critical band on the basis of an allowed noise level for each critical band; and
    bit number altering means alters the bit number by changing the allowed noise level in response to the mode number for each block.

11. The apparatus of claim 7, wherein the transient state determining means receives the signal component in blocks in a frequency range as the time domain signal.

12. The apparatus of claim 7, wherein the transient state determining means includes:
    a dividing means for dividing into sub blocks each block of the signal before the orthogonal transform processing;
    a energy determining means for determining an energy for each sub block;
    a mode generating means for performing a comparison in order of the energies of the sub blocks derived from one block, and for generating a mode number for the block in response to the comparison.

13. The apparatus of claim 12, wherein:
    the dividing means divides each block into a first sub block, a second sub block, a third sub block, and a fourth sub block in order, each sub block including plural samples, each sample having an amplitude;

the energy determining means determines the energy of each sub block by squaring the amplitude of each sample in the sub block to provide a square, and by summing the squares of the amplitudes of the samples in the sub block to provide the energy $P_n$ of the sub block, where n is an ordinal number of the sub block; and the mode generating means generates a mode number of:

zero when $(P_2+P_3+P_4)/P_1 < k_1$, one when $(P_2+P_3+P_4)/P_1 \geq k_1$, and $(P_3+P_4)/P_2 < k_2$, two when $(P_3+P_4)/P_2 \geq k_2$, and $P_4/P_3 < k_3$, and three when $P_4/P_3 \geq k_3$, where $k_1$ is 9, $k_2$ is 6, and $k_3$ is 3.

14. The apparatus of claim 12, wherein the bit number altering mans receives the mode number for each block from the transient state determining means, and increases the bit numbers allocated to blocks having a high mode number.

15. The apparatus of claim 14, wherein:

the orthogonally-transformed signal components in blocks are combined into critical bands;

the bit allocation means allocates a quantizing bit number for each critical band on the basis of an allowed noise level for each critical band; and the bit number altering means alters the bit allocation by changing the allowed noise level in response to the mode number for each block.

16. The apparatus of claim 7, wherein the bit number altering means increases the bit numbers allocated to the orthogonally-transformed components in block having a high mode number.

17. The apparatus of claim 16, wherein the bit number altering means additionally decreases the bit numbers allocated to the orthogonally-transformed signal components in blocks having a low mode number.

18. The apparatus of claim 1, wherein the bit number altering means increases the bit numbers allocated to the orthogonally-transformed components in blocks that the transient state determining means determines to include a rising late in the block.

19. The apparatus of claim 18, wherein the bit number altering means additionally decreases the bit numbers allocated to the orthogonally-transformed components in blocks that the transient state determining means determines to lack a rising transient late in the block.

* * * * *

UNITED STATES PATENT AND TRADEMARK OFFICE
CERTIFICATE OF CORRECTION

PATENT NO. : 5,268,685

DATED : December 7, 1993

INVENTOR(S) : Yoshihito Fujiwara

It is certified that error appears in the above - identified patent and that said Letters Patent is hereby corrected as shown below:

On the title page:
Please add:

-- [73]  Assignee:  Sony Corporation,
                   Tokyo, Japan--

Signed and Sealed this

Sixteenth Day of January, 1996

Attest:

BRUCE LEHMAN

Attesting Officer   Commissioner of Patents and Trademarks